United States Patent [19]
Anvari

[11] Patent Number: 5,594,385
[45] Date of Patent: Jan. 14, 1997

[54] ULTRA-LINEAR FEEDFORWARD AMPLIFIER WITH ADAPTIVE CONTROL AND METHOD FOR ADAPTIVE CONTROL

[75] Inventor: Kiomars Anvari, Walnut Creek, Calif.

[73] Assignee: Aval Communications, Inc., Walnut Creek, Calif.

[21] Appl. No.: 422,596

[22] Filed: Apr. 14, 1995

Related U.S. Application Data

[63] Continuation-in-part of Ser. No. 282,132, Jul. 28, 1994, Pat. No. 5,485,120.

[51] Int. Cl.⁶ .......................................................... H03F 1/26
[52] U.S. Cl. .............................................. 330/149; 330/151
[58] Field of Search ................................. 330/52, 149, 151

[56] References Cited

U.S. PATENT DOCUMENTS

| | | | |
|---|---|---|---|
| 3,922,617 | 11/1975 | Denniston et al. | 330/149 |
| 4,412,185 | 10/1983 | Gerard | 330/149 |
| 5,119,040 | 6/1992 | Long et al. | 330/151 X |
| 5,386,198 | 1/1995 | Ripstrand et al. | 330/52 |

*Primary Examiner*—Steven Mottola
*Attorney, Agent, or Firm*—Townsend and Townsend and Crew LLP

[57] ABSTRACT

An adaptive control system and method is provided in a feed-forward linear amplifier, and in particular a multi-channel linear amplifier, wherein analyzed distortion or error detection of nonlinear distortion components of the output signal of a main amplifier element is used to correct distortion in amplification of an information signal. Analysis of the distortion is based on a sweep of the entire operating frequency band from which the distortion components are extracted. I.F. sampling (sub-harmonic sampling) may be used in analog-to-digital conversion of an I.F. signal to detect the distortion within a pass-band.

17 Claims, 8 Drawing Sheets

ULTRA-LINEAR FEEDFORWARD AMPLIFIER WITH ADAPTIVE CONTROL AND METHOD FOR ADAPTIVE CONTROL

CROSS REFERENCE TO RELATED APPLICATION

This application is a continuation-in-part of patent application Ser. No. 08/282,132, filed Jul. 28, 1994, entitled Feed-Forward Power Amplifier System With Adaptive Control And Control Method, now U.S. Pat. No. 5,485,120, issued Jan. 16, 1996.

BACKGROUND OF THE INVENTION

The present invention relates to radio frequency (RF) power amplifiers and methods for minimizing distortion by employing adaptive control circuitry, particularly in feed forward power amplifiers, and the application of such control circuitry in wireless telecommunication systems, especially multi-carrier amplifiers.

Amplifiers as used to amplify an electrical signal are typically not perfectly linear over the whole of their operating ranges, and the nonlinearities in their transfer characteristics introduce distortion at the output.

Class "A" and "AB" amplifiers at best produce –30 to –35 dBc third order intermodulation (IM3) distortion unless they are operated significantly below maximum power. To achieve a desired power level with such inherent inefficiencies requires a very high power amplifier, which is not always a viable solution.

A well-known linearization technique is the use of feed forward control. However, there is a potential problem with standard feed-forward circuits in high-power applications, since in the design of the distortion (error) amplifier the fact that for a class-A or class-AB main amplifier, at least 25 to 30 dB of further cancellation is required to achieve –60 dBc IM3. The implication is that an amplitude error of less than 0.5 dB and a phase error of less than one degree must be achieved for proper operation of the system. Although the amplifier system can initially be set to meet these performance specifications, it is widely believed, as a result of component aging, environmental conditions, and other factors which introduce drift, such systems are dynamic and will inevitably fail to sustain required performance levels.

One potential solution is to create a feedback loop based on a dynamic vector modulator which can be added to the amplifier assembly with a feed-forward linearizer. The dynamic vector modulator might be controlled through a microprocessor or DSP-based controller. A high level block diagram of such a feed-forward amplifier 380 with an adaptive controller 382 is shown in FIG. 2. The present invention is of this class.

U.S. Pat. No. 3,922,617, issued Nov. 25, 1975 to Denniston, discloses a feed-forward amplifier system as shown in FIG. 3. In this system, a sample of the input signal is subtractively combined with a sample of the output signal to produce a sample of the distortion products. The distortion sample is adjusted in phase and amplitude and subtractively combined with the device Output signal to produce a distortion-reduced system output. First and second pilot signals, applied to the input of the feed-forward amplifier and the output of the main amplifier respectively, are detected in the sample of distortion product and the system output in order to produce control signals which adjust the phase and amplitude of the input signal and the distortion signal to provide a system which automatically compensates for uncontrolled variations caused by system components and operating environment.

The Denniston system requires a coherent detection network for the injected pilot signals to provide the correct control signal for phase and amplitude adjustment. Coherent detection adds inherent complexity to the system and makes implementation significantly difficult, especially for multi-carrier systems.

U.S. Pat. No. 4,412,185, issued Oct. 25, 1983 to Gerard, describes another feed-forward amplifier system, as shown in FIG. 4, herein. Referring to the numbered regions of the figure, the signals from elements 8 and 5 are subtracted at element 7 to provide a distortion signal amplified and inverted at element 10 which is combined at element 11 with amplified signal 26. A reference signal from frequency generator 13 is injected at main amplifier 2 into the in-band frequency, such that it appears at the output terminal as if an amplification-induced distortion. Monitor circuit 14 monitors the reference signal from frequency generator 13, present at output terminal 3, and modifies the characteristics of phase and amplitude equalizer 15, so as to remove injected reference signal 13 from amplified output signal at output terminal 3.

As with the Denniston system, the reference (pilot) signal used may be either a single tone, which is adjusted successively to a desired reference frequency, or employs a comb of frequencies like those typically generated by a comb generator. Where a single reference signal is employed, it must be monitored and employed to repeatedly adjust the appropriate frequency band of the equalizer for each successive reference frequency in order to perform a cancellation. Where a comb of frequencies is used, monitoring must be frequency selective, and therefore it must adjust and respond to each particular comb frequency while the appropriate band of the equalizer is adjusted.

While this prior art patent teaches a system that attempts to achieve intermodulation product cancellation over a wide range of frequency bands, it nonetheless suffers from the shortcoming that several equalizer band adjustments must be performed before a desired degree of distortion cancellation is achieved. The time required to perform these successive corrections adversely impacts system distortion cancellation and performance.

The prior art teaches the down-conversion of RF signals to DC, prior to sampling and digital processing, thus resulting in the introduction of spurious noise and so-called "DC offset." These imperfections, though not problematic for many applications, can seriously degrade system performance when introduced into the digital domain, especially in cases where the control of system components is sensitive to minor changes in sampled and processed RF signals.

What is needed is distortion minimization system for feed-forward amplifiers, including multi-carrier feed-forward amplifiers, which, rapidly and with precision, maintains a close dynamic balance between delay and amplification branches of both main and distortion (error) amplifier loops, thus maximizing distortion cancellation in a multitude of conditions. Furthermore, such systems must be easy to implement, be economical, and must not introduce undue complexity.

SUMMARY OF THE INVENTION

According to the invention, an adaptive control system and method is provided in a feed-forward linear amplifier, and in particular a multi-channel linear amplifier system, wherein analyzed distortion or error detection of nonlinear distortion components of the output signal of a main amplifier element is used to correct distortion in amplification of an information signal. According to the invention, analysis of the distortion is based on a sweep of the entire operating frequency band from which the distortion components are extracted. I. F.. sampling (sub-harmonic sampling) may be used in analog-to-digital conversion of an I. F.. signal to detect the distortion within a pass-band.

In a particular embodiment, an amplifier circuit receives an input signal having at least one carrier therein in a specified frequency band, and includes a feed-forward circuit with a distortion (error) detection circuit for detecting a nonlinear distortion component of a main amplifier output and a distortion (error) rejection circuit for amplifying a detected distortion signal by a distortion (error) amplifier, which detected distortion signal is injected into the output of the main amplifier to cancel and thus eliminate the distortion components.

In a specific embodiment the distortion (error) detection circuit is controlled by a phase and gain equalizer which could comprise, for example, a phase shifter and variable attenuator. The equalizer is operationally positioned at the input of the main amplifier. The control signals for the equalizer are provided by detecting the power of the input carrier signals using samples of the distortion detector output, and minimizing their amplitude at the output of the distortion (error) detector.

The distortion (error) cancellation circuit is controlled by a similar phase and gain equalizer in the distortion (error) amplifier path. The control signals for the equalizer can be provided by the following:

a- Using a fast frequency synthesizer to scan the in-band and out-of-band in ΔF steps, differentiate the distortion (error) products from the desired modulated carriers, measure their amplitude at the output of the feed-forward amplifier, and produce the control signals to minimize them.

b- Scanning the ΔF bands which contain a pilot signal (provided pilot is used), extract the pilot, measure its power, and produce the control signal to minimize it.

Samples from main amplifier input and output and distortion (error) amplifier inputs are first processed in a receiver which converts the RF signals to filtered intermediate frequency (IF) signals. These IF signals are then converted directly to the digital domain, without conversion to DC. Digital signal processing yields the equalizer control signals.

The present invention also provides a means for automatically calibrating amplifier systems at the time of manufacture and/or periodically thereafter, in order that the systems compensate for changes in overall operating tolerances and characteristics.

The present invention also includes means for generating an alarm signal which shuts down the amplifier system in the event of a significant system control imbalance.

The invention also provide means for remotely monitoring the output spectrum of the feed-forward amplifier using an RS232 interface of a micro-processor which communicates with the digital signal processing section.

The invention also provide means for monitoring the number of the input carriers and dynamically adjust the feed-forward amplifier operation bias to improve the overall power efficiency.

Because of the speed and accuracy with which the present invention can maintain feed-forward amplifier systems in balance and thus virtually distortion-free, it is particularly well-suited for implementation with multi-carrier systems. The invention provides an opportunity for significantly down-sizing and consolidating amplification equipment commonly used in mobile cellular, micro-cellular, personal communication systems and networks (PCS and PCN), fixed wireless, and special mobile radio (SMR) systems.

The invention will be better understood upon reference to the following detailed description in connection with the following drawings.

DESCRIPTION OF SPECIFIC EMBODIMENTS

In a specific embodiment of the invention, a feed-forward amplifier system using the signal samples from the three monitoring points is coupled with an adaptive control system. The signal samples from main amplifier output are used by the adaptive controller to calculate the control signal for the equalizer in the distortion (error) amplifier path. The signal samples from error amplifier inputs are used by the adaptive controller to calculate the control signal for the equalizer in the main amplifier path.

A. Feed-forward Amplifier.

Figure 1:
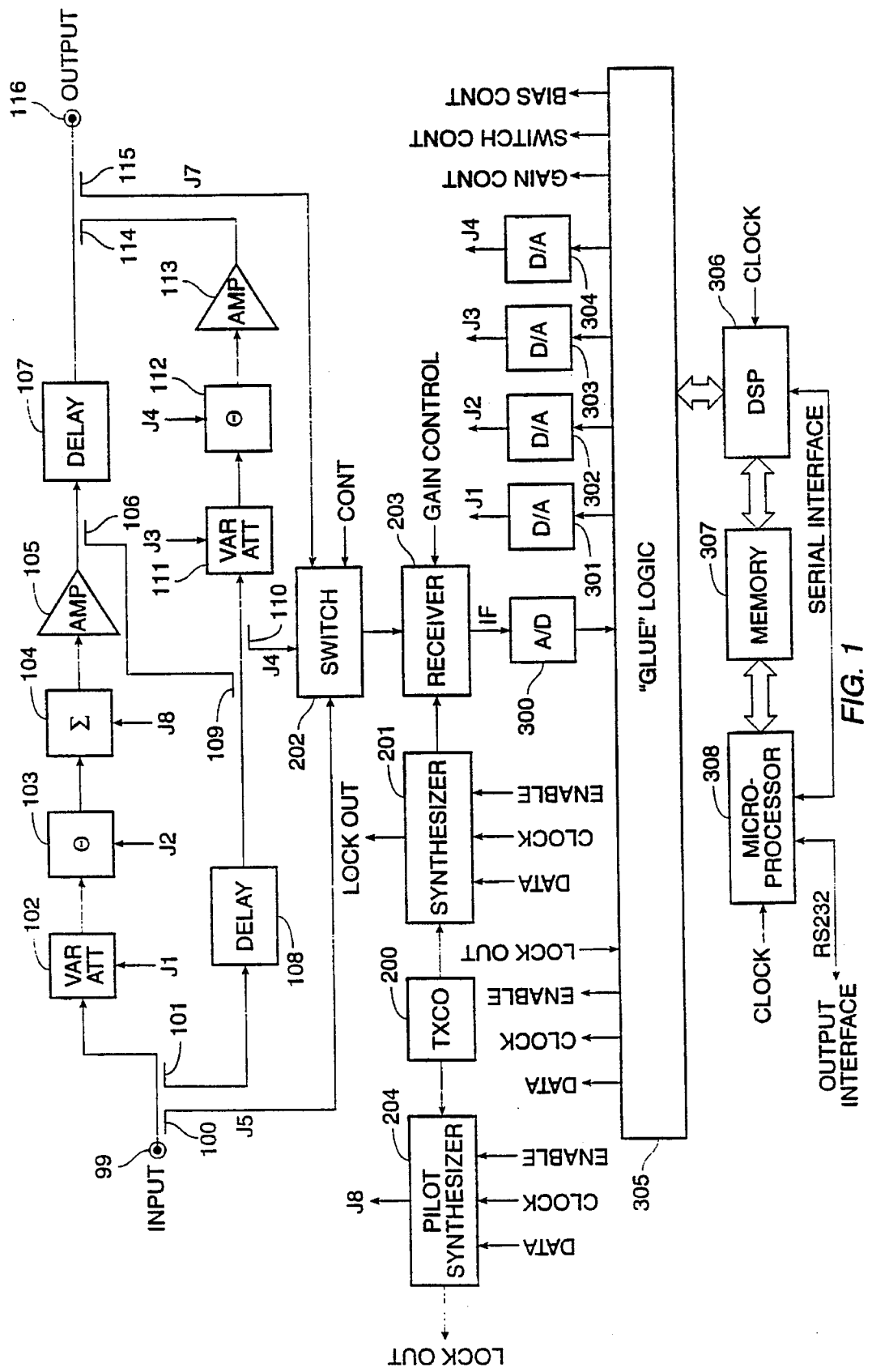
FIG. 1. is a feed-forward amplifier system with adaptive controller relying upon three monitoring points according to the invention.
Figure 2:
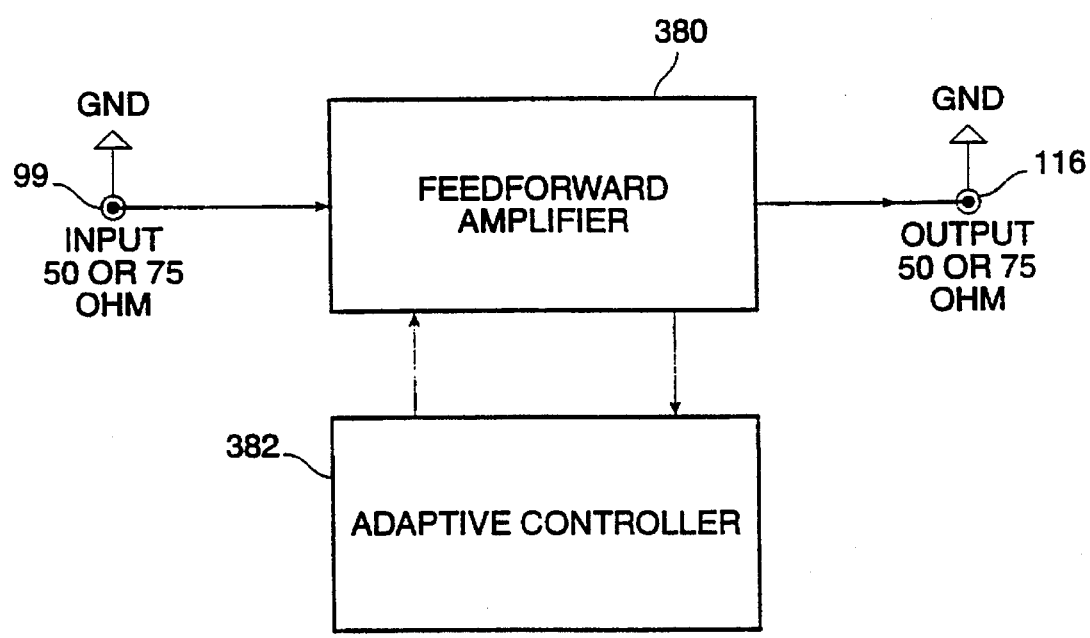
FIG. 2. is a block diagram of a feed-forward amplifier with an adaptive controller of the prior art.
Figure 3:
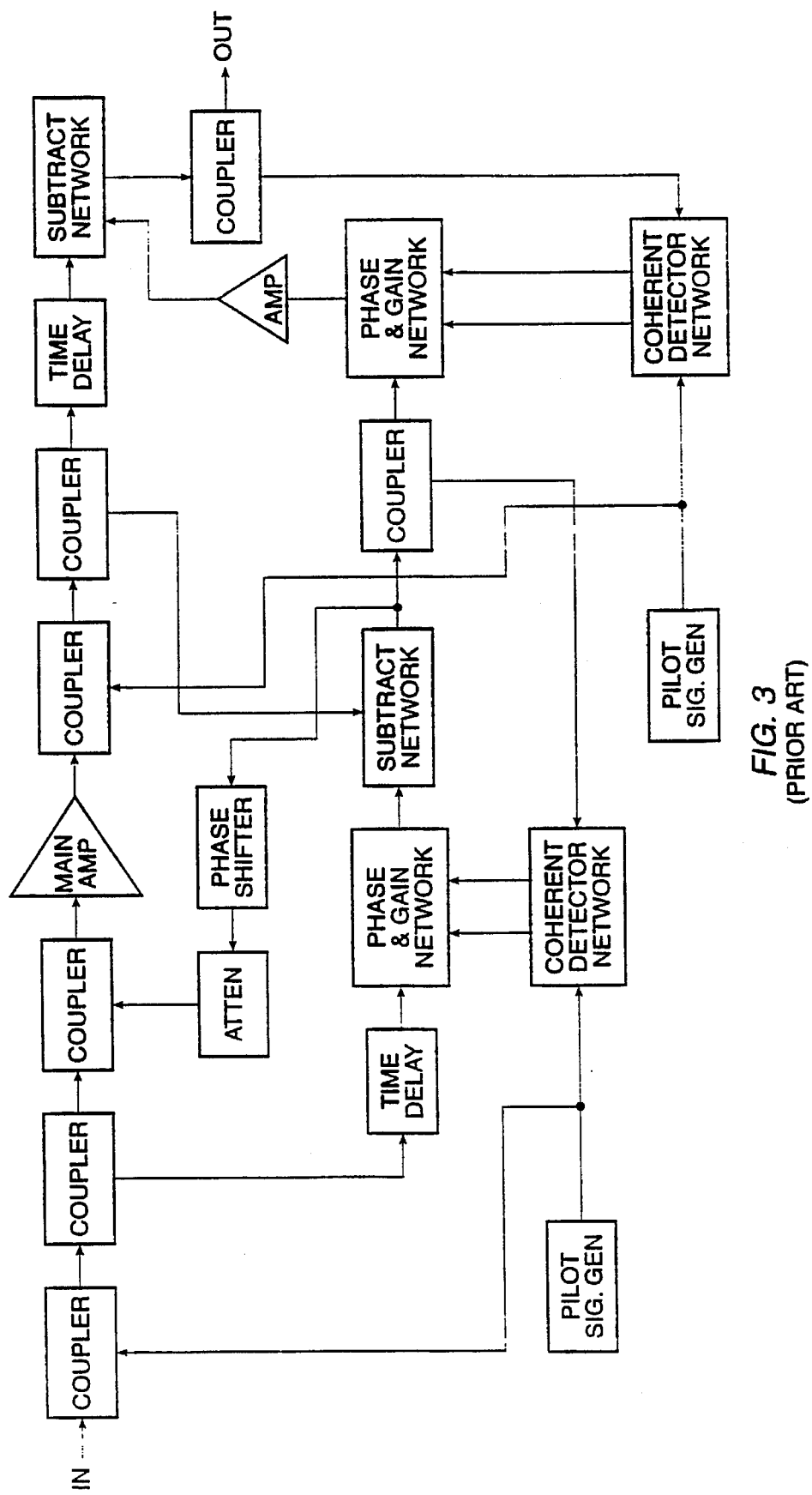
FIG. 3. is a block diagram of a feed-forward amplifier system with injected pilot signal of the prior art.
Figure 4:
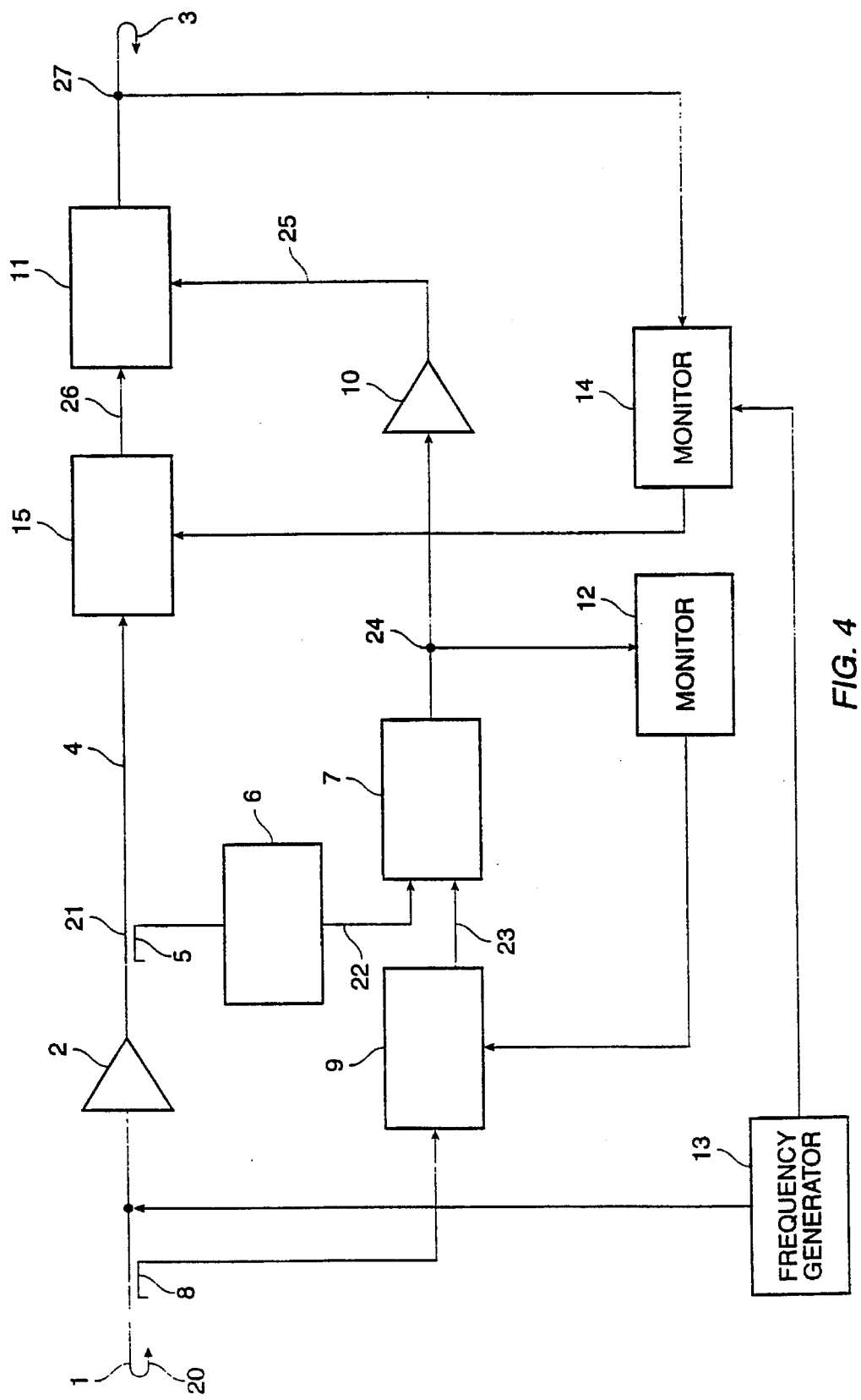
FIG. 4. is a feed-forward amplifier system of the prior art.
Figure 5:
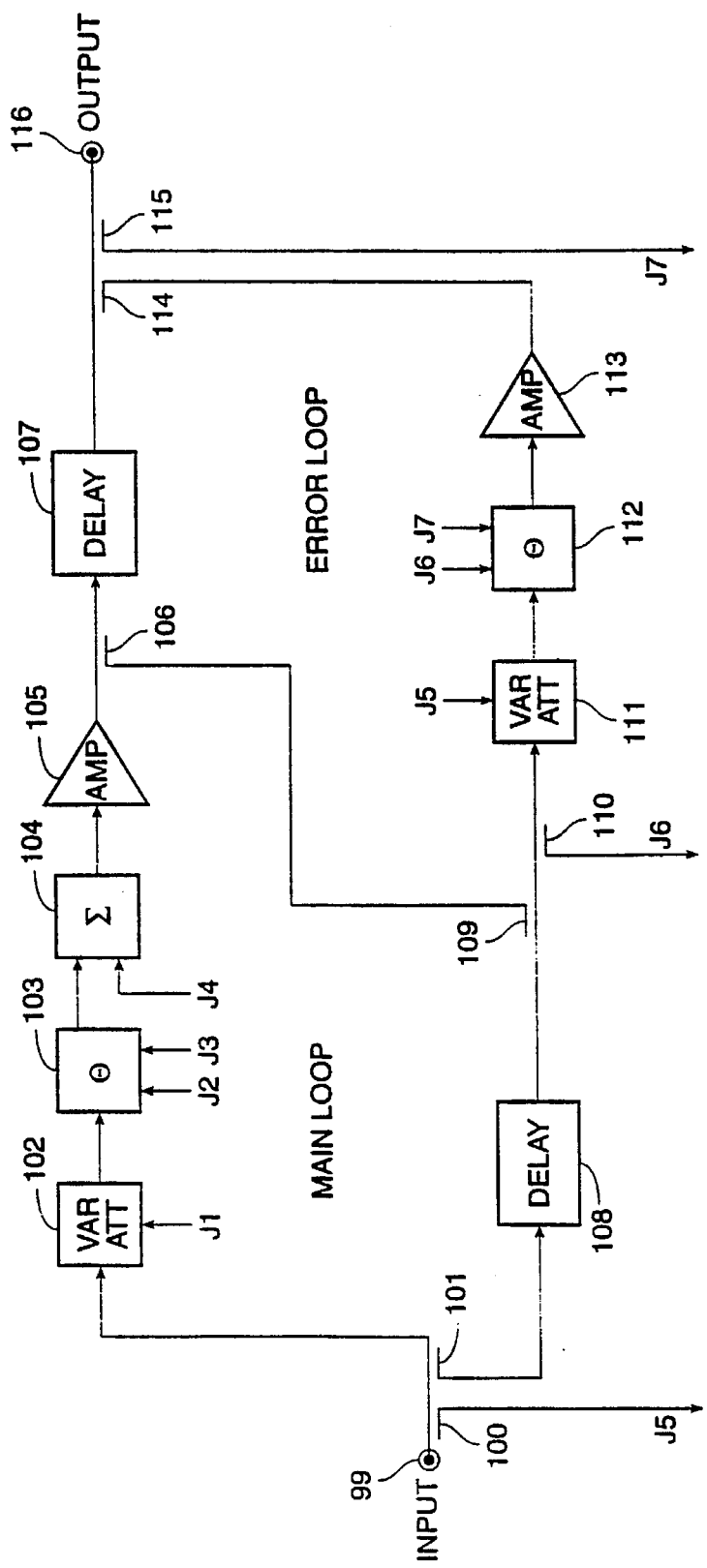
FIG. 5. is a feed-forward amplifier system representing a preferred embodiment of the present invention.

FIG. 1. shows an amplifier system 370 consisting of a feed-forward amplifier system 380 and an adaptive controller system 382 according to the invention. The structure of feed-forward amplifiers is generally known in the art. An example of a feed-forward amplifier adapted to the present invention is shown in FIG. 5 in detail with (50 Ohm or 75 Ohm input and output impedances). That which is not shown in FIG. 5 is shown in FIG. 1., namely, the adaptive controller system 382 according to the invention.

A comparison with a prior art feed-forward amplifier as can be visualized from FIG. 5 may be instructive. The prior art feed-forward amplifier system consisted of a main amplifier 105, a phase shifter 103, an attenuator 102, and a delay line 108. An input signal 99 is applied to a coupler 100. The first output of coupler 100 is applied to coupler 101 and the second output of coupler 100 is used as the input monitoring signal (J5). The first output of coupler 101 is amplitude adjusted by attenuator 102 and then phase adjusted by phase shifter 103. The phase and gain adjusted signal is combined with the pilot (if used) in combiner 104 and then amplified to the desired level by main amplifier 105. The output of main amplifier 105 consists of both the desired signal, the unwanted distortion, and the pilot signal (if used.)

Main amplifier 105 output is applied to coupler 106 where a sample of the output is taken. This sample signal is applied to distortion (error) detector coupler 109. The second input of coupler 109 is the output of coupler 100 delayed by delay line 108.

If the propagation delay balance between the branch containing main amplifier 105 and the delay line branch with delay line 108 is perfect, the output of distortion (error) detector coupler 109 will be only the distortion introduced by main amplifier 105. However, when this condition does not exist, the adaptive controller according to the present invention will adjust attenuator 102 and phase shifter 103 to make the output of distortion (error) detector coupler 109 as close as possible to the distortion signal. The output of coupler 109 is the scaled distortion signal produced by main amplifier 105 and will be used to minimize distortion in the output of the feed-forward amplifier by using the distortion (error) loop.

The distortion (error) signal from distortion (error) detector coupler 109 (a subtracter) is a sampled signal which is sampled continuously by sampler 110. The sampled signal (via J6) is then sent to the adaptive controller for processing.

The second amplifier loop consists of distortion amplifier 113, phase shifter 112, attenuator 111, and delay line 107. The output of delay 108 combined with the continuously sampled output of amplifier 105 is first applied to attenuator 111 and then phase shifter 112 for gain and phase adjustment. A small continuously-sampled signal is taken at 110 and sent to the controller via J6. The amplitude and phase adjusted distortion (error) signal is amplified by distortion (error) amplifier 113 before being applied to the distortion (error) cancellation coupler 114 (effectively a subtracter.) The second input of distortion cancellation coupler 114 is the delayed (by delay line 107) output of main amplifier 105. Delay line 107 is used to provide equal propagation delay along both signal paths of main amplifier 105 and distortion amplifier 113.

If the attenuators, phase shifters and delay lines in both the main loop and the distortion (error) loop provide synchronous propagation delay between the two branches of each path, the output 116 will contain negligible distortion.

The output of distortion cancellation coupler 114 is sampled by sampler 115 before reaching output port 116. The sample signal (J7) is sent to the adaptive controller for processing.

B. Adaptive Controller

The adaptive controller 382 according to the invention as shown in FIG. 1. comprises three sub-units. They are:

1. RF sub-unit
2. Digital hardware sub-unit
3. Adaptive controller

1. RF sub-unit:

The RF sub-unit is shown in FIG. 1. It provides an interface between the digital processing domain and the feed-forward amplifier 380. It also provides the reference clock 200 for the local oscillator synthesizer 201 and pilot synthesizer 204. The other inputs of synthesizer 201 are the clock (CLK), data (Data), and latch enable (EN) signals. Synthesizer 201 also provides a lock detect (Lock Det) output signal which indicates if synthesizer 201 is out of lock. Frequency synthesizer (SYN) 201 produces the local oscillator signals for the receiver 203. The receiver 203 down converts the output of the switch 202 to an intermediate frequency (IF) where the IF signal is filtered and amplified before being sampled. The receiver 203 can be a single (one IF stage) or double conversion (two IF stages) receiver.

The switch 202 is controlled by the digital sub-unit. The control signal from the digital sub-unit force the switch 202 to select one of the signals from the monitoring points J5, J6, J7.

The gain control signal adjust the receiver 203 gain when necessary to keep the signal level at the input of the A/D above the common voltage of A/D and within the linear operation point of the A/D.

The synthesizer 204 will be used to generate a pilot frequency for the case that the distortion cancellation at the output of the feed-forward amplifier is achieved by a pilot frequency. Similar to synthesizer 201 the pilot synthesizer has four inputs (reference frequency, data, clock, latch enable) and one output to indicate the lock status of the synthesizer.

2. Digital hardware sub-unit:

The adaptive controller digital hardware sub-unit shown in FIG. 1 consists of analog to digital (A/D) converters 300, digital to analog (D/A) converters 301, 302, 303, and 304, "glue logic" 305, digital signal processor (DSP) 306, micro-processor 308, and memory 307. (For the purposes of this disclosure, "glue logic" refers to conventional interface logic known in the art.) The IF signal from the RF sub-unit is converted to digital signal by A/D converter 300. Digital control signals produced by DSP 306 for phase shifters 103 and 112 and attenuators 102 and 111 are converted to analog signals by D/A converters 301, 302, 303, and 304 before being applied to the feed-forward amplifier through J1, J2, J3, J4, respectively.

"Glue logic" 305 provides the interface from DSP 306 to A/D converters 300 and D/A converters 301, 302, 303, and 304. "Glue logic" 305 also serves as the interface for the programming for synthesizers 201 and 204, gain control of receiver 203, and input control of switch 202. "Glue logic" 305 will also serve as bias control for the feed-forward amplifier.

DSP 306 executes an adaptive control algorithm and produces the feed-forward amplifier control signals for phase shifters 103 and 112 and attenuators 102 and 111. The input to DSP 306 includes the digitally converted IF signal from the RF sub-unit via A/D converters 300 and "glue logic" 305. DSP 306 also performs the programming for synthesizers 201 and 204.

Memory 307 stores the program which contains the adaptive controller algorithm for use by DSP 306 and alarm and control software for use by micro-processor.

Micro-processor 308 may provide an interface to the outside world through an RS232 port. The micro-processor 308 also communicates with the DSP to obtain diagnostic data as well as data to be used for frequency band spectrum analysis. The micro-processor 308 may also receive the information on the operation and failure of various section of the feed-forward amplifier, power supply, fan, heat sink, and the adaptive controller hardware, which are functions not essential to this invention.

3. Adaptive Controller Algorithm:

The adaptive controller algorithm which will be executed by DSP 306 comprises two functions. They are:

a. Power measurement/Estimation.
b. Search Algorithm/Correction.
a. Power measurement/Estimation.

Figure 6:
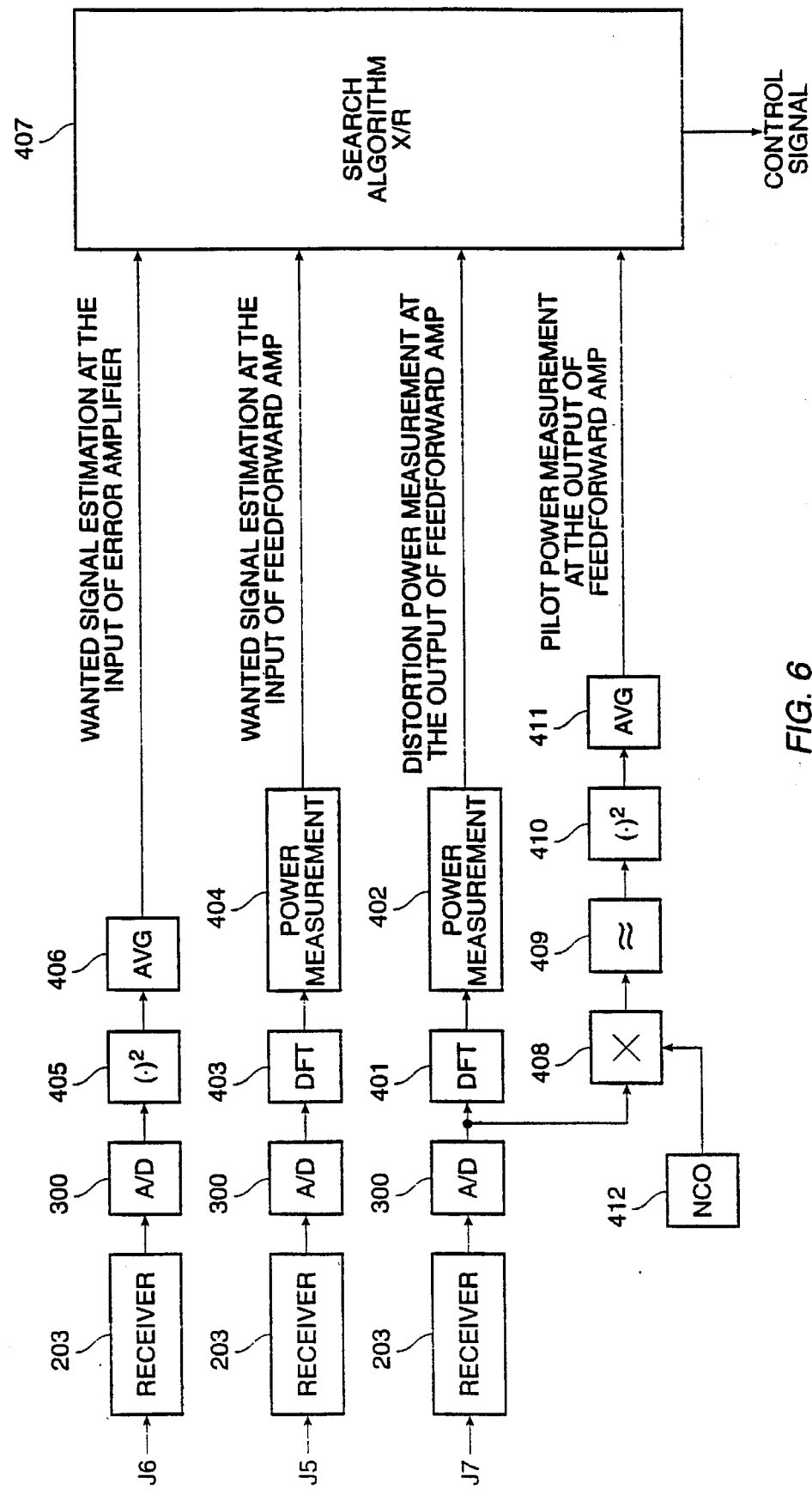
FIG. 6. is a block diagram of a device according to the invention for carrying out power measurement and estimation.

FIG. 6 illustrates the distortion (error) estimation at the output of the feed-forward power amplifier and the wanted signal estimation at the input of the error amplifier in accordance with the invention. The process is executed in two steps of power measurement and estimation. For power measurement the frequency band of interest is divided into smaller segments of ΔF bandwidths. The synthesizer 201 tunes into the center frequency of these bands and facilitates the receiver 203 to down convert the ΔF band to an IF frequency for filtering and amplification. The IF signal is then sampled (sub-harmonic sampling may be used) by A/D converter 300 that provides the required linearity and dynamic range. The function of down conversion, filtering, amplification, and A/D conversion is typically performed for the signals from J5, J6, and J7 one at a time, although parallel processing could be performed by providing dedicated ΔF band processing. The switch 202 will select one of the signals from J5, J6, and J7. The synthesizer 201 will tune to the center of the ΔF bands starting from the beginning (lowermost) of the amplifier operating frequency band to the end (uppermost) of the frequency band for the signals at J5 and J6. For the signal at J7 a wider bandwidth (at least three times the amplifier operating frequency band) must be be swept in order to capture the distortion which appears out of band.

The signal from J6, after being converted into digital signal is squared (by element 405) and averaged (by element 406). The process of squaring and averaging is performed for each individual ΔF frequency band over the total operating band of the feed-forward amplifier. The output in the form of a "wanted signal metric" of the averager 406 is applied into the search processor which carries out an algorithm to minimize the output by adjusting the control signal of the attenuator 102 and the phase shifter of 103 in the main loop of the feed-forward amplifier.

The signal from J7, after being converted into a digital signal, is subjected to two processes when no pilot signal is used. For those ΔF bands which are outside the operating frequency band of the feed-forward amplifier the sampled signal is squared and averaged. For those ΔF bands which are part of the operating frequency band of the feed-forward amplifier the digital sample signal is applied to the Discrete Fourier Transform (DFT) block 401 before application to power measurement block 402. The DFT block 401 divides the ΔF band into still smaller bands in order to provide the information on individual in band carriers and distortion components. The power measurement block 402 measures the power of the individual carriers and the distortion components.

Figure 7A:
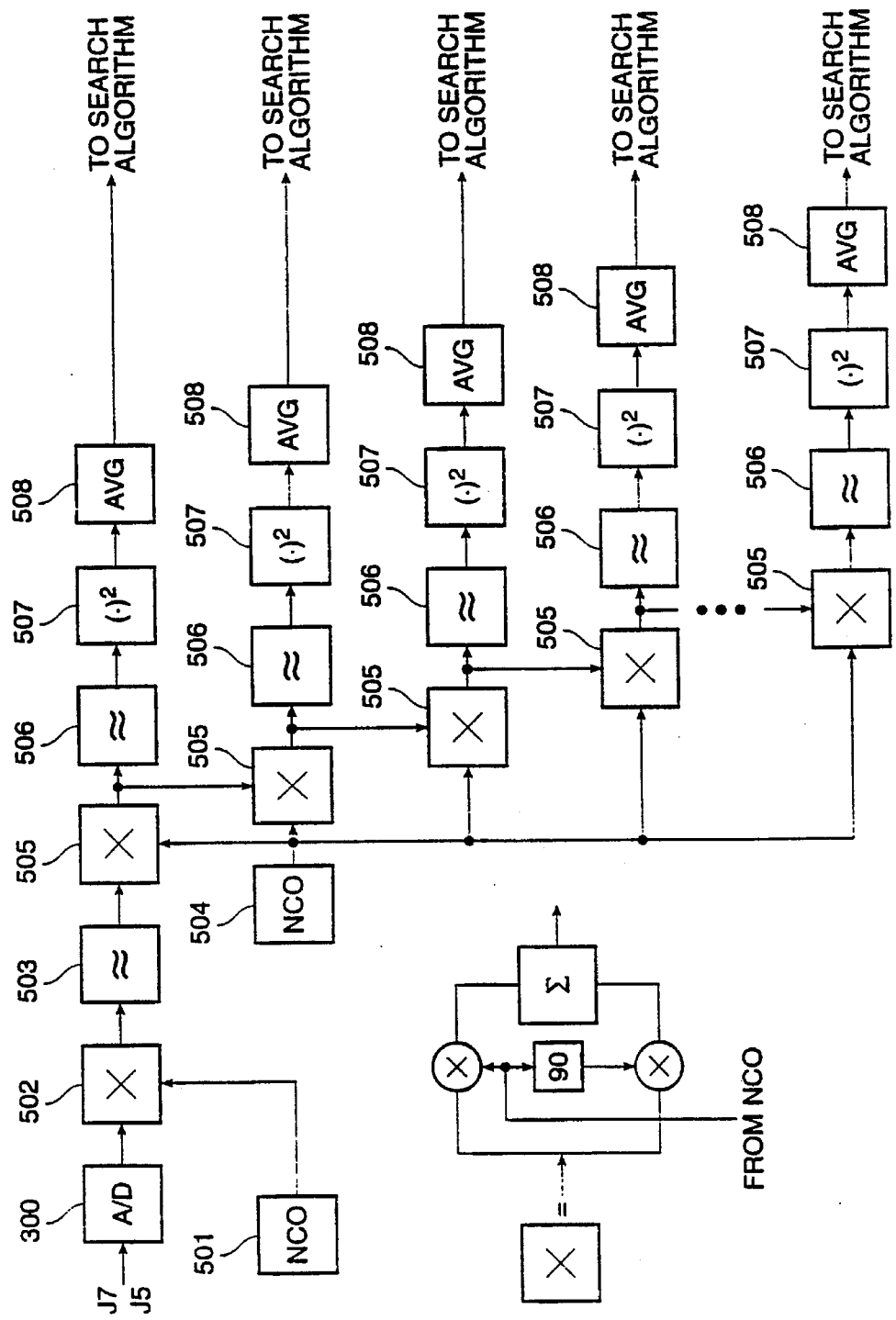
FIG. 7a. is a block diagram of DFT and power measurement in complex domain.

FIG. 7a shows the block diagram of a DFT and power measurement technique when sub-harmonic sampling is used. In this case the first sub-harmonic is down converted (mixer 502) to DC (baseband) by an appropriate numerically controlled oscillator (NCO) 501 before being filtered 503. The filtered baseband signal is then down converted (mixer 505) for individual carriers and distortion components using a common NCO 504 and number of mixers. Each carrier of distortion components is then separated by a low-pass filter 506 before being applied to the squarer 507 and averaging 508 blocks for power measurement. The output of the power measurement blocks is then sent to the search processor 407 for processing. The DFT and power measurement processes in this technique are done in the complex domain, which generally requires two parallel or quasi-parallel processes.

Figure 7B:
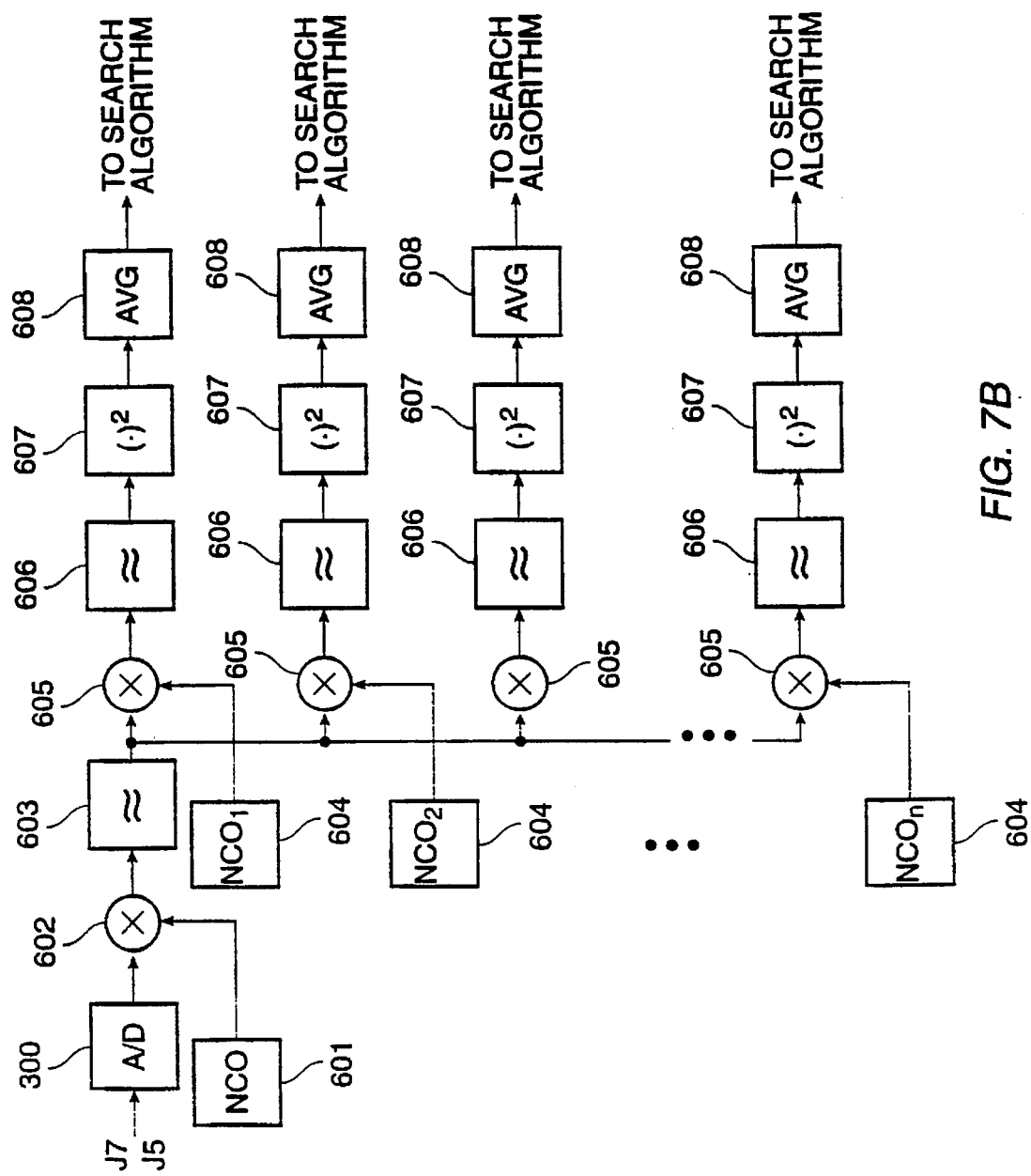
FIG. 7b. is a block diagram of DFT and power measurement in real domain.

A second technique of DFT and power measurement which is performed in the real domain is shown in FIG. 7b. The output of the A/D 300 is down converted to DC by mixer 602 and the NCO 601. The down converted signal is then filtered by low pass filter 603. The filtered signal is then used to down convert the appropriate carrier or distortion signals by a chain of mixers 605 and NCOs 604. The down converted carrier or distortion signal is first lowpass filtered 606 and then squared 607 and averaged 608 for power measurement. The measured power is then applied to search processor 407. It should be noted that the NCO2 to NCOn may be derived from NCO1 by proper selection of the IF and sampling frequency.

When a pilot is not used, the search processor 407 separates the main carriers from the distortion components, adds up the power of the total distortion in and out of the operating frequency of the amplifier and minimizes it by adjusting the attenuator 111 and the phase shifter 112.

When a pilot is used, the receiver 203 only needs to convert the J7 signal to an IF signal for the ΔF bands which contain the pilot. These ΔF bands are then sampled (sub-harmonic sampling can be used) in order to be processed in digital domain. The sample information for the ΔF bands with the pilot are digitally down converted 408 using an NCO 412 in order to transfer the pilot information to DC for power measurement. The down converted signal is then filtered by low pass filter 409 then squared using square block 410 and averaged using average block 411. The pilot measured power is then applied to the search processor 407 to be minimized by adjusting the attenuator 102 and phase shifter 103.

The signal from J5 is down converted to IF by receiver 203, sampled (sub-harmonic sampling can be used) by A/D 300 and applied to the DFT block 403 for extracting the input carrier signals (or any spurious signal) to be used by power measurement block 404. The power of the input carriers or the spurious signals are then sent to the search processor 407 to examine the status of the input signal as well as number of carrier which are on. These input carrier information can also be used to determine the location of the distortion in order to speed up the process of the monitoring of the J7 signal.

b. Search Processor/Corrector

The search algorithm which is executed by DSP 306 obtains the results of the power measurement algorithms and calculates the correction values for the equalizer components in the main amplifier and error amplifier loop. The search algorithms for the main amplifier and for the error amplifier are different and independent. The search algorithm for the main amplifier receives the measured power for the ΔF bands within the operating band of the amplifier which it sums and then, based on the total power, calculates the adjustment value for the phase shifter 102. The search algorithm continues adjusting the phase of phase shifter 102 over a number of sweeps until it reaches a minimum. Once a minimum is reached the algorithm will adjust the attenuator 103 in a similar manner until it reaches a minimum. This process is repeated.

Similar techniques of correction or adjustment are used by the search algorithm for the error amplifier loop. The two search algorithms are totally independent. The search algorithm for the error amplifier receives the power of the in-band and out-of-band distortion (when a pilot is not used), sums them up and calculates the adjustment value or correction value for phase shifter 112 and the attenuator 111. When a pilot is used, the search algorithm will only need the measured power of the pilot for the adjustment process. While many alternative search algorithms might be used, particularly useful search algorithms are disclosed in U.S. patent application Ser. No. 08/282,132 filed Jul. 28, 1994 in the name of Kiomars Anvari entitled FEED-FORWARD POWER AMPLIFIER SYSTEM WITH ADAPTIVE CONTROL AND CONTROL METHOD, which is incorporated herein by reference and made a part hereof.

The invention has now been explained with reference to specific embodiments. Other embodiments will be apparent to those of ordinary skill in the art upon reference to the following detailed description in connection with the accompanying claims. It is therefore not intended that this invention be limited, except as indicated by the appended claims.

What is claimed is:

1. In a method for linear amplification of wideband radio frequency energy in a feed-forward amplifier system having at least a main amplifier, a method for correcting distortion in amplification of an information signal, said method comprising the steps of:

extracting nonlinear distortion components from the output of said main amplifier;

analyzing said nonlinear distortion components to produce analyzed signals;

formulating error correcting signals from said analyzed signals; and correcting said distortion in amplification of said information signals by means of said error correcting signals applied to a distortion amplifier connected in parallel with said main amplifier, wherein said extracting step comprises I. F. sampling during analog-to-digital conversion of an I. F. signal for identifying distortion components within a amplifier output.

2. The method according to claim 1, wherein said I. F. sampling comprises subharmonic sampling.

3. The method according to claim 1, wherein said main amplifier output includes a pilot signal and wherein said analyzing step further includes referencing said pilot signal.

4. In a method for linear amplification of wideband radio frequency energy in a feed-forward amplifier system having at least a main amplifier, a method for correcting distortion in amplification of an information signal, said method comprising the steps of:

extracting nonlinear distortion components from the output of said main amplifier;

analyzing said nonlinear distortion components to produce analyzed signals;

formulating error correcting signals from said analyzed signals; and correcting said distortion in amplification of said information signals by means of said error correcting signals applied to a distortion amplifier connected in parallel with said main amplifier, wherein said extracting step includes scanning across said entire operating frequency band and said scanning comprises using a fast frequency synthesizer to scan in ΔF steps both inband and out-of-band.

5. The method according to claim 4, wherein said analyzing step comprises differentiating distortion products from desired modulated carriers and measuring amplitude of said distortion products at an output of said main amplifier, for formulating said error correcting signal and for producing a control signal to minimize said distortion products.

6. The method according to claim 5, wherein said differentiating of distortion products from desired modulated carriers comprises performing a discrete Fourier transform (DFT) in equivalent complex numbers.

7. The method according to claim 6 wherein said DFT comprises:

downconverting a single subharmonic of digital sampled signals to baseband to produce a baseband subharmonic;

applying a complex number DFT by downconverting each component to D.C. of said baseband subharmonic using a numerically-controlled oscillator in common between in-phase and quadrature-phase elements of said complex number DFT.

8. The method according to claim 5, wherein said differentiating of distortion products from desired modulated carriers comprises performing a discrete Fourier transform (DFT) in real numbers.

9. The method according to claim 8 wherein said DFT comprises:

downconverting each component of a single subharmonic to D.C. using a numerically-controlled oscillator.

10. The method according to claim 4, wherein a pilot signal is injected into the signal path of said main amplifier, and wherein said scanning comprises scanning ΔF bands which contain said pilot signal.

11. The method according to claim 10 wherein said extracting step comprises extracting the pilot signal, and wherein said analyzing step comprising measuring power of said pilot signal to produce at least one of said error correcting signals.

12. In a method for linear amplification of wideband radio frequency energy in a feed-forward amplifier system having at least a main amplifier, a method for correcting distortion in amplification of an information signal, said method comprising the steps of:

extracting nonlinear distortion components from the the output of said main amplifier;

analyzing said nonlinear distortion components to produce analyzed signals;

formulating error correcting signals from said analyzed signals; and correcting said distortion in amplification of said information signals by means of said error correcting signals applied to a distortion amplifier connected in parallel with said main amplifier further including the steps of:

monitoring input signals of said distortion amplifier for presence of wanted output signals from said main amplifier after subtraction of unamplified signals;

measuring at least power level of said wanted signals to produce a wanted signal metric; and adjusting attenuation and phase of input signals to said main amplifier to minimize said wanted signal metric.

13. The method according to claim 12 wherein said measuring step comprises:

sampling said wanted signals after subtraction to produce sampled values;

squaring the absolute value of said sampled values to obtain squared values representative of instantaneous power; and averaging said instantaneous power over a selected period to produce a wanted signal estimation.

14. In a method for linear amplification of wideband radio frequency energy in a feed-forward amplifier system having a main amplifier, a distortion amplifier and an adaptive controller, a method for correcting distortion in amplification of an information signal, said method comprising the steps of:

sampling from main amplifier input and main amplifier output and from distortion amplifier input to obtain RF sample signals;

converting said RF sample signals to filtered intermediate frequency (IF) signals;

extracting from said filtered IF signals nonlinear distortion components from the entire operating frequency band of the output of said main amplifier;

analyzing said nonlinear distortion components to produce analyzed signals;

formulating error correcting signals from said analyzed signals; and correcting said distortion in amplification of said information signals by means of said error correcting signals applied to a distortion amplifier connected in parallel with said main amplifier.

15. The method according to claim 14 wherein said IF signals are converted directly to the digital domain without conversion to DC, and wherein digital signal processing yields said error correcting signals.

16. A feed-forward linear amplification system for amplifying radio frequency energy comprising:

a main amplifier;

a distortion amplifier having a bandwidth substantially greater than the operational bandwidth of said main amplifier and coupled in parallel with and being phase synchronous with said main amplifier;

a distortion detection circuit for detecting distortion in output across said operational bandwidth of said main amplifier; and an adaptive controller coupled to said distortion detection circuit and including a distortion cancellation means for generating control signals for dynamically varying attenuation of signals through said distortion amplifier to cancel distortion in output of said feed-forward linear-amplification system, further including a first phase and gain equalizer for controlling said distortion detection circuit, said first phase and gain equalizer comprising a phase shifter and variable attenuator, said first phase and gain equalizer being operationally positioned at the input of the main amplifier, wherein control signals for the equalizer are provided by detecting power of input carrier signals using samples of the distortion detection circuit output and minimizing amplitude of said input carrier signals at the output of the distortion detection circuit.

17. The amplification system according to claim 16 further including a second phase and gain equalizer for controlling said distortion cancellation circuit, said second phase and gain equalizer comprising a phase shifter and variable attenuator, said second phase and gain equalizer being operationally positioned in the signal path of said distortion amplifier, wherein control signals for the second equalizer are provided by detecting power of distortion components using samples of output of the feedforward amplifier circuit and by minimizing amplitude of said distortion components at the output of the feedforward amplifier.

* * * * *